(12) United States Patent  
Lee

(10) Patent No.: US 9,130,042 B2
(45) Date of Patent: Sep. 8, 2015

(54) THIN FILM TRANSISTOR AND METHOD FOR FABRICATING THE SAME

(71) Applicant: LG Display Co., Ltd., Seoul (KR)

(72) Inventor: Bok-Young Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/104,073

(22) Filed: Dec. 12, 2013

(65) Prior Publication Data

US 2014/0209894 A1    Jul. 31, 2014

(30) Foreign Application Priority Data

Jan. 25, 2013 (KR) .................. 10-2013-0008715

(51) Int. Cl.
*H01L 29/10* (2006.01)
*H01L 29/786* (2006.01)
*H01L 29/66* (2006.01)

(52) U.S. Cl.
CPC .... *H01L 29/78633* (2013.01); *H01L 29/66969* (2013.01); *H01L 29/7869* (2013.01)

(58) Field of Classification Search
CPC ........................... H01L 29/7869; H01L 21/01
USPC ............................................. 257/43; 438/104
See application file for complete search history.

(56) References Cited

U.S. PATENT DOCUMENTS

| 6,521,913 B1* | 2/2003 | Murade | 257/59 |
| 2002/0190332 A1* | 12/2002 | Lee et al. | 257/397 |
| 2006/0246360 A1* | 11/2006 | Hwang | 430/5 |
| 2014/0183476 A1* | 7/2014 | Kwon et al. | 257/40 |

* cited by examiner

*Primary Examiner* — Jami M Valentine
(74) *Attorney, Agent, or Firm* — Morgan, Lewis & Bockius LLP

(57) ABSTRACT

Disclosed is a thin film transistor and a method of fabricating the same which includes a light-shielding layer made of the same material as a semiconductor layer on a substrate, wherein the light-shielding layer absorbs light incident upon the semiconductor layer, thereby preventing deterioration in characteristics of the thin film transistor caused by exterior light.

10 Claims, 4 Drawing Sheets

THIN FILM TRANSISTOR AND METHOD FOR FABRICATING THE SAME

This application claims the benefit of Korean Patent Application No. 10-2013-0008715, filed on Jan. 25, 2013 which is hereby incorporated by reference as if fully set forth herein.

BACKGROUND OF THE INVENTION

1. Field of the Invention

The present invention relates to a thin film transistor. More specifically, the present invention relates to a thin film transistor and a method for fabricating the same.

2. Discussion of the Related Art

In accordance with the evolution of information-dependent society, demand for display devices has vastly increased. In response to this demand, in recent years, a variety of display devices such as liquid crystal displays (LCDs), plasma display panels (PDPs), electro-luminescent displays (ELDs), and vacuum fluorescent displays (VFDs) are being researched and some thereof are utilized as displays for various equipment. Such a display device includes a thin film transistor formed as a switching device in each pixel region.

The thin film transistor includes an oxide thin film transistor (oxide TFT) which is a thin film transistor using oxide for a semiconductor layer, an organic thin film transistor (organic TFT) which uses an organic material for a semiconductor layer, an amorphous silicon thin film transistor (amorphous silicon TFT) which includes a thin film transistor substrate using amorphous silicon for a semiconductor layer, and a poly-silicon thin film transistor (polysilicon TFT) which includes a thin film transistor substrate using polycrystalline silicon for a semiconductor layer.

In particular, the oxide thin film transistor has advantages of higher charge mobility and lower leakage current characteristics, as compared to the silicon thin film transistor. Furthermore, since the silicon thin film transistor is formed by a high-temperature process and the oxide semiconductor layer is subjected to a crystallization process, the silicon thin film transistor is disadvantageous in terms of increase in area due to deteriorated uniformity during crystallization, as area increases. However, the oxide thin film transistor is suitable for a low-temperature process and is advantageous in terms of increase in usable area.

FIG. 1 is a sectional view illustrating a related art thin film transistor, which illustrates an oxide thin film transistor with a top gate structure.

As shown in FIG. 1, the general oxide thin film transistor includes a substrate 10, a light-shielding layer 11 formed on the substrate 10 and a buffer layer 12 covering the light-shielding layer 11. In this case, the light-shielding layer 11 prevents exterior light from being incident upon the semiconductor layer 13. Generally, the light-shielding layer 11 is made of a non-transparent metal such as molybdenum (Mo), chromium (Cr), copper (Cu), tantalum (Ta), or aluminum (Al).

In addition, the general oxide thin film transistor includes a semiconductor layer 13 formed on the buffer layer 12, and a gate insulating film 14a and a gate electrode 14 formed on the semiconductor layer 13 in this order. The interlayer insulating film 15 covering the gate electrode 14 is formed such that it exposes both edges of the semiconductor layer 13, and source and drain electrodes 16a and 16b are formed to connect to both edges of the exposed semiconductor layer 13.

In this regard, in the general oxide thin film transistor, the light-shielding layer 11 and the semiconductor layer 13 having different etching rates should be formed using different masks, so that the semiconductor layer 13 completely overlaps the light-shielding layer 11. Furthermore, generally, since the light-shielding layer 11 is formed of a non-transparent metal material and thus has a considerably low resistance, the buffer layer 12 should have a sufficient thickness.

SUMMARY OF THE INVENTION

Accordingly, the present invention is directed to a thin film transistor and a method for fabricating the same that substantially obviate one or more problems due to limitations and disadvantages of the related art.

An object of the present invention is to provide a thin film transistor including a light-shielding layer made of the same material as a semiconductor layer on a substrate and a method for fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a thin film transistor includes: a substrate; a light-shielding layer and a buffer layer formed on the substrate in this order; a semiconductor layer formed on the buffer layer, the semiconductor layer formed of the same material as the light-shielding layer; a gate insulating film and a gate electrode formed on the semiconductor layer in this order; an interlayer insulating film formed on the substrate such that it covers the gate electrode, the interlayer insulating film including a source contact hole and a drain contact hole exposing source and drain areas of the semiconductor layer, respectively; and a source electrode and a drain electrode electrically connected to the semiconductor layer through the source contact hole and the drain contact hole.

In another aspect of the present invention, a method for fabricating a thin film transistor includes: sequentially forming a light-shielding layer and a buffer layer on a substrate; forming a semiconductor layer using the same material as the light-shielding layer on the buffer layer; sequentially forming a gate insulating film and a gate electrode on the semiconductor layer; forming an interlayer insulating film on the substrate such that it covers the gate electrode and includes a source contact hole and a drain contact hole exposing source and drain areas of the semiconductor layer, respectively; and forming a source electrode and a drain electrode electrically connected to the semiconductor layer through the source contact hole and the drain contact hole.

An edge of the light-shielding layer may correspond to an edge of the semiconductor layer.

The light-shielding layer and the semiconductor layer may be formed of transparent conductive oxide.

The light-shielding layer may be formed over the entire surface of the substrate.

A thickness of the light-shielding layer may be equivalent to a thickness of the semiconductor layer.

Since the light-shielding layer and the semiconductor layer are formed of the same material, light having a wavelength range that can be absorbed in the semiconductor layer is already absorbed in the light-shielding layer, no light is absorbed in the semiconductor layer.

Since the light-shielding layer and the semiconductor layer are formed by using the same mask, the processing cost is significantly reduced.

The buffer layer can exhibit sufficient insulating property although it has a small thickness, since transparent conductive oxide has a considerably high resistance.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a thin film transistor and a method for fabricating the same according to the present invention will be described in detail with reference to the annexed drawings.

Figure 1:
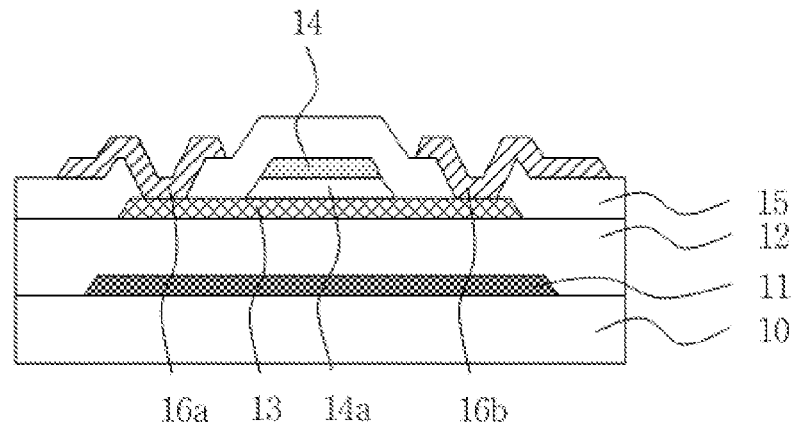
FIG. 1 is a sectional view illustrating a related art thin film transistor.
Figure 2A:
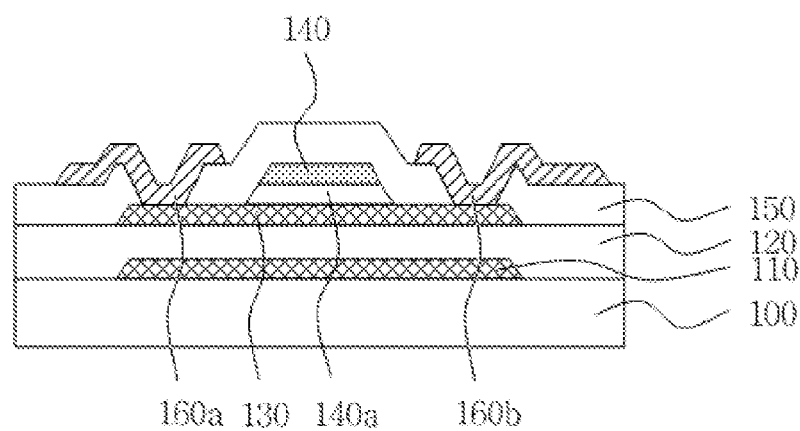
FIGS. 2A and 2B are sectional views illustrating a thin film transistor according to the present invention.
Figure 2B:
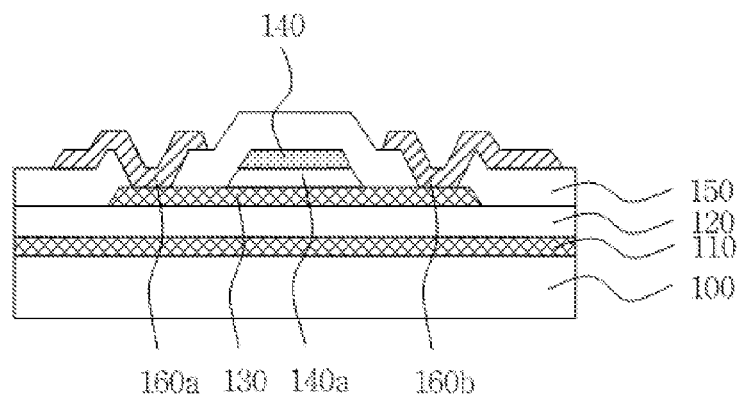

FIGS. 2A and 2B are sectional views illustrating a thin film transistor according to the present invention.

As shown in FIGS. 2A and 2B, the thin film transistor according to the present invention includes a substrate 100, a light-shielding layer 110 formed on the substrate 100, a buffer layer 120 formed on the light-shielding layer 110, a semiconductor layer 130 formed on the buffer layer 120, a gate insulating film 140a and a gate electrode 140 formed on the semiconductor layer 130 in this order, an interlayer insulating film 150 covering the gate electrode 140, and a source electrode 160a and a drain electrode 160b connected to source and drain areas of the semiconductor layer 130, respectively, exposed by selectively removing the interlayer insulating film 150. In particular, the light-shielding layer 110 is made of the same material as the semiconductor layer 130.

Specifically, the light-shielding layer 110 prevents exterior light from being incident upon the semiconductor layer 130 through the substrate 100. Generally, the thin film transistor has a top gate structure, light incident upon the rear surface of the substrate 100 is also incident upon the semiconductor layer 130, thus causing deterioration in light reliability of the semiconductor layer 130 and resulting in deterioration such as degradation of properties of the thin film transistor.

Accordingly, in order to prevent this problem, a light-shielding layer is formed on the substrate using a non-transparent metal such as molybdenum (Mo), chromium (Cr), copper (Cu), tantalum (Ta), or aluminum (Al). At this time, when the light-shielding layer is also formed on a light emission region, in a case of a liquid crystal display device including a backlight unit on the rear surface of the substrate, the light-shielding layer is formed by a photolithographic process using a mask, the backlight unit does not pass through the liquid crystal layer due to the light-shielding layer.

In this regard, since the light-shielding layer and the semiconductor layer have different etching rates, although the light-shielding layer and the semiconductor layer are formed using the same mask, an edge of the semiconductor layer does not correspond to an edge of the light-shielding layer, thus causing exterior light to be incident upon the edge of the semiconductor layer. Accordingly, generally, the light-shielding layer and the semiconductor layer should be formed using different masks.

However, the light-shielding layer 110 of the present invention is formed of the same material as the semiconductor layer 130. For example, in a case in which the thin film transistor according to the present invention is an oxide thin film transistor using oxide for the semiconductor layer 130, the light-shielding layer 110 and the semiconductor layer 130 are formed of an oxide containing one or more elements selected from gallium (Ga), indium (In), zinc (Zn) and tin (Sn), and oxygen (O), specifically, transparent conductive oxide such as zinc oxide (ZnO), indium zinc oxide (IZO), indium tin oxide (ITO), or indium gallium zinc oxide (IGZO).

Accordingly, as shown in FIG. 2A, an edge of the semiconductor layer 130 can correspond to an edge of the light-shielding layer 110 by forming the semiconductor layer 130 and the light-shielding layer 110 using the same mask. Furthermore, in order to simplify the process, as shown in FIG. 2B, the light-shielding layer 110 may be formed over the entire surface of the substrate 100 including a transmission region. In this case, as described above, the light-shielding layer 110 is formed of a transparent conductive oxide, thus not affecting transmittance of a display device.

The buffer layer 120 is formed of an inorganic insulating material such as silicon oxide or silicon nitride, thus enabling the semiconductor layer 130 to be insulated from the light-shielding layer 110. In particular, since the transparent conductive oxide has a considerably high resistance, the buffer layer 120 can maintain sufficient insulating properties, although the light-shielding layer 110 is formed to have a smaller thickness, as compared to a case in which the light-shielding layer is formed of a non-transparent metal. In addition, the semiconductor layer 130 is formed on the buffer layer 120.

As described above, when the light-shielding layer 110 and the semiconductor layer 130 are formed of the same material, the light-shielding layer 110 and the semiconductor layer 130 absorb light having the same wavelength range among exterior light. Accordingly, among light incident through the substrate 100, light with a predetermined wavelength range is absorbed in the light-shielding layer 110 and the light with a remaining wavelength range is incident upon the semiconductor layer 130 through the buffer layer 120. However, since light having a wavelength range that can be absorbed in the semiconductor layer 130 is already absorbed in the light-shielding layer 110, no light is absorbed in the semiconductor layer 130.

For example, when the semiconductor layer 130 and the light-shielding layer 110 are formed of IGZO, the semiconductor layer 130 and the light-shielding layer 110 absorb light having a wavelength of 500 nm or less.

In this regard, among light incident from the substrate 100 upon the thin film transistor, all light having a wavelength of 500 nm or less is absorbed in the light-shielding layer 110 and all light having other wavelength range transmits the semiconductor layer 130. Accordingly, effects of exterior light on the semiconductor layer 130 are minimized.

Accordingly, the thin film transistor according to the present invention has improved light reliability, since all light having the same wavelength as that absorbed in the semiconductor layer 130 is absorbed in the light-shielding layer 110. In particular, as described above, the light-shielding layer 110 does not require an additional mask process, since the light-shielding layer 110 may be formed over the entire surface of the substrate 100. In addition, a gate insulating film 140$a$ to insulate the gate electrode 140 from the semiconductor layer 130 is formed on the semiconductor layer 130 and a gate electrode 140 is formed on the gate insulating film 140$a$. The gate electrode 140 has a laminate structure including two or more layers made of a metal material, such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, a Cu alloy/Al, a Cu alloy/a Mo alloy, a Cu alloy/an Al alloy, Al/a Mo alloy, a Mo alloy/Al, an Al alloy/a Mo alloy, a Mo alloy/an Al alloy, or Mo/an Al alloy, or a single layer structure including a metal material, such as Mo, Ti, Cu, Al, Nd, Al, Cr, a Mo alloy, a Cu alloy, or an Al alloy.

In addition, the interlayer insulating film 150 formed over the entire surface of the substrate 100 including the gate electrode 140 is formed of an inorganic insulating material such as silicon oxide or silicon nitride, or an insulating organic material. The source and drain areas of the semiconductor layer 130 are connected to the source electrode 160$a$ and the drain electrode 160$b$ through a source contact hole (not shown) and a drain contact hole (not shown) formed by selectively removing the interlayer insulating film 150.

As described above, in the thin film transistor according to the present invention, the light-shielding layer 110 is formed of the same material as the semiconductor layer 130 on the substrate 100 and the light-shielding layer 110 absorbs light incident upon the semiconductor layer 130. Accordingly, deterioration in properties of thin film transistor caused by exterior light can be prevented.

In particular, in a case in which the thin film transistor is an oxide thin film transistor, the semiconductor layer 130 and the light-shielding layer 110 are formed of a transparent conductive oxide and the light-shielding layer 110 is thus formed over the entire surface of the substrate, thus enabling process simplification and manufacturing cost reduction. Furthermore, the buffer layer 120 can exhibit sufficient insulating property although it has a small thickness, since transparent conductive oxide has a considerably high resistance.

Figure 3:
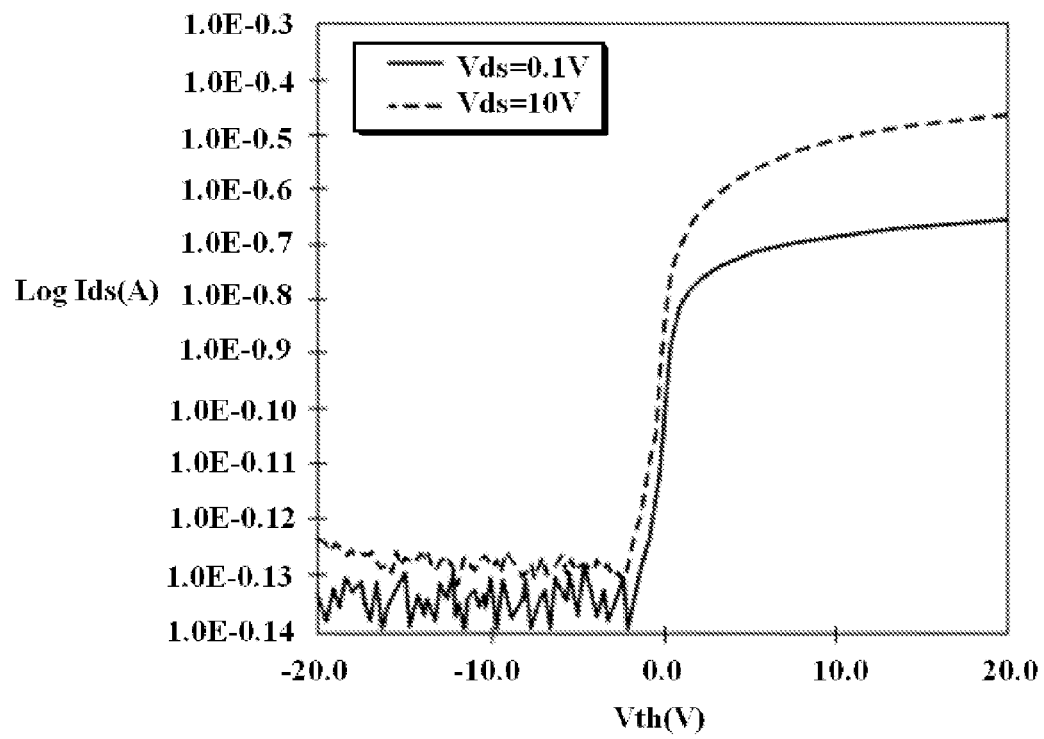
FIG. 3 is a graph showing characteristics of the thin film transistor according to the present invention.

FIG. 3 is a graph showing characteristics of a thin film transistor according to the present invention, which shows characteristics of the thin film transistor including a light-shielding layer made of IGZO having a thickness of 1,000 Å.

As shown in FIG. 3, in the thin film transistor according to the present invention, a case in which a drain to source voltage (Vds) is 0.1V and a case in which Vds is 10V have a similar threshold voltage of a transistor (Vth) when drain to source current (Ids) begins to flowing. That is, the thin film transistor according to the present invention has improved light reliability and thus improved Vth characteristics, since the light-shielding layer 110 formed of the same material as the semiconductor layer 130 absorbs all light having a wavelength range that could be absorbed in the semiconductor layer 130. As a result, when the drain to source voltages (0.1V, 10V) are different, but the threshold voltages are similar, the transistors can be driven by a low voltage. Accordingly, it is possible to decrease the power consumption and to prevent deterioration in characteristics of the thin film transistor caused by exterior light.

Hereinafter, a method for fabricating the thin film transistor according to the present invention will be described with reference to the annexed drawings.

FIGS. 4A to 4E are sectional views illustrating an overall process of the method for fabricating the thin film transistor according to the present invention, which illustrates the light-shielding layer formed over the entire surface of the substrate.

Figure 4A:
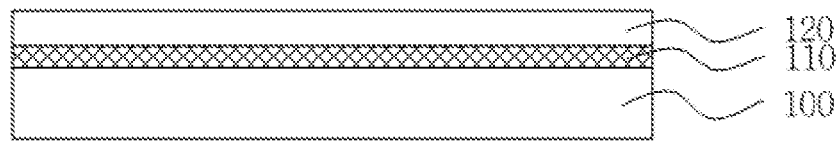
FIGS. 4A to 4E are sectional views illustrating an overall process of a method for fabricating the thin film transistor according to the present invention.

As shown in FIG. 4A, a light-shielding layer 110 and a buffer layer 120 are sequentially formed on a substrate 100. At this time, in a case in which the thin film transistor is an oxide thin film transistor, the light-shielding layer 110 is formed of oxide containing one or more elements selected from gallium (Ga), indium (In), zinc (Zn) and tin (Sn), and oxygen (O), specifically, transparent conductive oxide such as zinc oxide (ZnO), indium zinc oxide (IZO), indium tin oxide (ITO), or indium gallium zinc oxide (IGZO).

In this case, the light-shielding layer 110 is transparent and thus does not affect transmittance of a display device, although the light-shielding layer 110 is formed over the entire surface of the substrate 100. Accordingly, the light-shielding layer 110 is formed over the entire surface of the substrate 100 without an additional patterning process. In addition, a buffer layer 120 is formed of an inorganic insulating material such as silicon oxide or silicon nitride, thus insulating the light-shielding layer 110 from the semiconductor layer as described later.

Figure 4B:
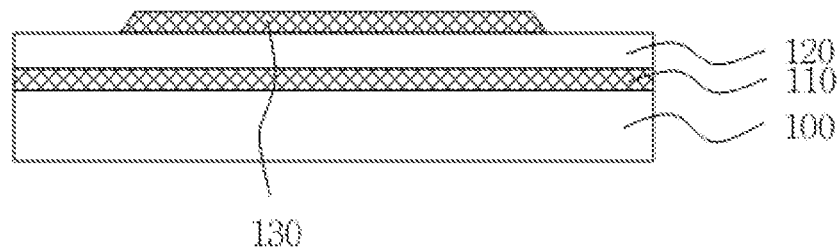

Subsequently, as shown in FIG. 4B, the same material as the light-shielding layer 110 is formed on the buffer layer 120 and is then patterned through a photolithographic process to form a semiconductor layer 130. When the light-shielding layer 110 and the semiconductor layer 130 are formed of the same material, the light-shielding layer 110 and the semiconductor layer 130 absorb the same wavelength range of light among exterior light.

Accordingly, among light incident through the substrate 100, light within a predetermined wavelength range is absorbed in the light-shielding layer 110 and light with the other wavelength range is incident upon the semiconductor layer 130 through the buffer layer 120. However, light having a wavelength range that can be absorbed in the semiconductor layer 130 is already absorbed in the light-shielding layer 110, the semiconductor layer 130 thus does not absorb any light, and light reliability of the semiconductor layer 130 can be improved.

In particular, although not shown, the light-shielding layer 110 may also be formed through a photolithographic process using a mask. In this case, as described above, the light-shielding layer 110 and the semiconductor layer 130 are formed of the same material, and the semiconductor layer 130 may be formed using a mask used for formation of the light-shielding layer 110.

In a related art thin film transistor, since the light-shielding layer and the semiconductor layer are formed of different materials, materials for the light-shielding layer and the semiconductor layer have different etching rates. Accordingly, although the light-shielding layer and the semiconductor layer are formed using the same mask, an edge of the semiconductor layer does not correspond to an edge of the light-shielding layer and exterior light may thus be incident upon the semiconductor layer.

However, as described above, in the thin film transistor according to the present invention, the light-shielding layer 110 and the semiconductor layer 130 that have edges corresponding to each other may be formed using the same mask.

Accordingly, light having a wavelength range absorbed in the semiconductor layer 130 is completely blocked by the light-shielding layer 110. In particular, in order to simplify the overall process and reduce manufacturing costs, as described above, the light-shielding layer 110 may be formed over the entire surface of the substrate 100.

Figure 4C:
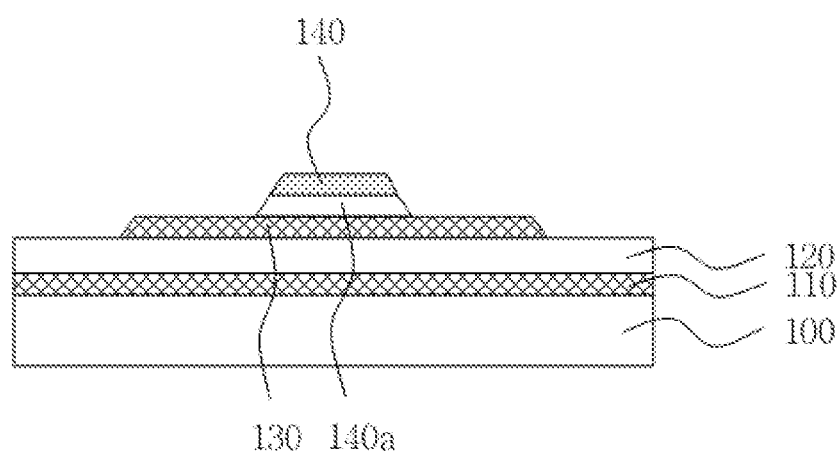

Subsequently, as shown in FIG. 4C, a gate insulating film 140a and a gate electrode 140 are sequentially formed on the semiconductor layer 130. First, an inorganic insulating material such as silicon oxide or silicon nitride and a gate metal layer are sequentially formed, and the material and the gate metal layer are patterned through a photolithographic process to form a gate insulating film 140a and a gate electrode 140.

At this time, the gate electrode 140 has a laminate structure including two or more layers made of a metal material, such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, a Cu alloy/Al, a Cu alloy/a Mo alloy, a Cu alloy/an Al alloy, Al/a Mo alloy, a Mo alloy/Al, an Al alloy/a Mo alloy, a Mo alloy/an Al alloy, or Mo/an Al alloy, or a single layer structure including a metal material, such as Mo, Ti, Cu, Al, Nd, Al, Cr, a Mo alloy, a Cu alloy, or an Al alloy.

Although not shown, source and drain areas of the semiconductor layer 130 not covered by the gate electrode 140 may be treated with plasma such as He, H2 or N2. This plasma treatment imparts conductivity to the source and drain areas of the semiconductor layer 130 not covered by the gate electrode 140, reduces resistance of the semiconductor layer 130 and thus improves contact properties, when the source and drain electrodes are connected to the source and drain areas of the semiconductor layer 130.

Figure 4D:
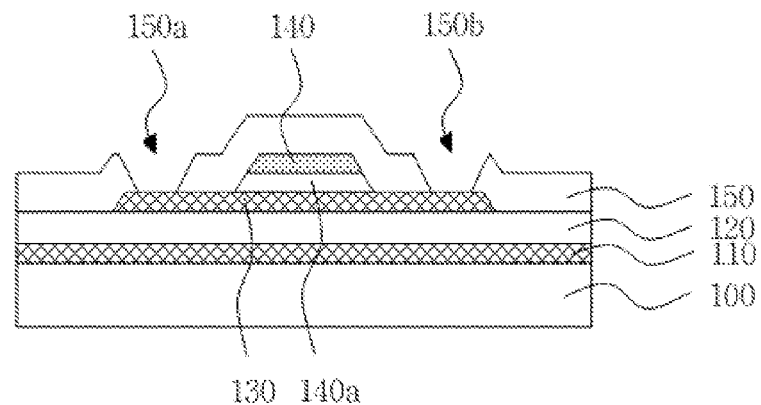

Then, as shown in FIG. 4D, an interlayer insulating film 150 is formed over the entire surface of the substrate 100 including the gate electrode 140. The interlayer insulating film 150 is selectively removed through a photolithographic process using a mask, to form a source contact hole 150a to expose one edge of the semiconductor layer 130 and a drain contact hole 150b to expose the other edge thereof.

Although the gate insulating film 140a overlaps only the gate electrode 140 in the drawing, the gate insulating film 140a may be formed over the entire surface of the substrate 100. In this case, the gate insulating film 140a is formed over the entire surface of the substrate 100 such that it covers the semiconductor layer 130, the gate electrode 140 is formed on the gate insulating film 140a, and the gate insulating film 140a and the interlayer insulating film 150 are selectively removed to form a source contact hole 150a and a drain contact hole 150b.

Figure 4E:
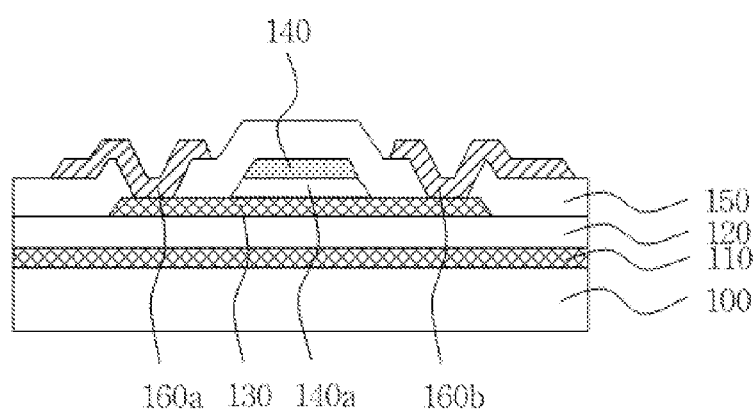

Then, as shown in FIG. 4E, a data metal layer is formed on the interlayer insulating film 150 and is then patterned through a photolithographic process to form a source electrode 160a and a drain electrode 160b. The source electrode 160a is connected to one edge of the semiconductor layer 130 through the source contact hole 150a and the drain electrode 160b is connected to the other edge of the semiconductor layer 130 through the drain contact hole 150b.

The method for fabricating the thin film transistor according to the present invention may be applied to oxide thin film transistors as well as thin film transistors with a top gate structure.

As apparent from the fore-going, the present invention provides a thin film transistor which includes a light-shielding layer made of the same material as a semiconductor layer on a substrate, wherein the light-shielding layer absorbs light incident upon the semiconductor layer, and a method for fabricating the same. Accordingly, deterioration in characteristics of the thin film transistor caused by exterior light can be prevented.

In particular, in a case in which the thin film transistor is an oxide thin film transistor, the semiconductor layer and the light-shielding layer are formed of a transparent conductive oxide and the light-shielding layer is thus formed over the entire surface of the substrate, thus enabling process simplification and manufacturing cost reduction. Furthermore, the buffer layer can exhibit sufficient insulating property although it has a small thickness, since the transparent conductive oxide has a considerably high resistance.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor comprising:
   a substrate;
   a light-shielding layer and a buffer layer on the substrate in this order;
   a semiconductor layer on the buffer layer, the semiconductor layer formed of the same material as the light-shielding layer;
   a gate insulating film and a gate electrode on the semiconductor layer in this order;
   an interlayer insulating film on the substrate such that it covers the gate electrode, the interlayer insulating film comprising a source contact hole and a drain contact hole exposing source and drain areas of the semiconductor layer, respectively; and
   a source electrode and a drain electrode electrically connected to the semiconductor layer through the source contact hole and the drain contact hole.

2. The thin film transistor according to claim 1, wherein an edge of the light-shielding layer corresponds to an edge of the semiconductor layer.

3. The thin film transistor according to claim 1, wherein the light-shielding layer is over the entire surface of the substrate.

4. The thin film transistor according to claim 1, wherein the light-shielding layer and the semiconductor layer are composed of transparent conductive oxide.

5. The thin film transistor according to claim 1, wherein a thickness of the light-shielding layer is equivalent to a thickness of the semiconductor layer.

6. A method for fabricating a thin film transistor comprising:
   sequentially forming a light-shielding layer and a buffer layer on a substrate;
   forming a semiconductor layer using the same material as the light-shielding layer on the buffer layer;
   sequentially forming a gate insulating film and a gate electrode on the semiconductor layer;
   forming an interlayer insulating film on the substrate such that it covers the gate electrode and comprises a source contact hole and a drain contact hole exposing source and drain areas of the semiconductor layer, respectively; and
   forming a source electrode and a drain electrode electrically connected to the semiconductor layer through the source contact hole and the drain contact hole.

7. The method according to claim 6, wherein an edge of the light-shielding layer corresponds to an edge of the semiconductor layer.

8. The method according to claim 6, wherein the light-shielding layer is over the entire surface of the substrate.

9. The method according to claim 6, wherein the light-shielding layer and the semiconductor layer are composed of transparent conductive oxide.

10. The method according to claim 6, wherein a thickness of the light-shielding layer is equivalent to a thickness of the semiconductor layer.

\* \* \* \* \*